United States Patent [19]

Kimura

[11] 4,027,272

[45] May 31, 1977

[54] AMPLIFIER

[75] Inventor: Hiromasa Kimura, Kawaguchi, Japan

[73] Assignee: Sony Corporation, Tokyo, Japan

[22] Filed: June 4, 1976

[21] Appl. No.: 692,745

[30] Foreign Application Priority Data

June 6, 1975 Japan .............................. 50-68707

[52] U.S. Cl. .............................. 330/30 D; 330/13; 330/17; 330/69
[51] Int. Cl.$^2$ ......................................... H03F 3/45
[58] Field of Search .............. 330/15, 13, 17, 30 D, 330/69

[56] References Cited

UNITED STATES PATENTS 3,760,288  9/1973  Leonard .......................... 330/30 D
3,904,972  9/1975  Seki .............................. 330/30 D X

*Primary Examiner*—Rudolph V. Rolinec
*Assistant Examiner*—Lawrence J. Dahl
*Attorney, Agent, or Firm*—Hill, Gross, Simpson, Van Santen, Steadman, Chiara & Simpson

[57] ABSTRACT

An amplifier includes a differential amplifier and a first collector follower amplifier connected to the output terminal of the differential amplifier. A second collector follower amplifier is provided, the input terminal of which is connected to the common impedance of the differential amplifier to receive one part of the voltage thereacross, and the output terminal of which is connected to the output terminal of the first collector follower amplifier so as to reduce the common mode gain of the differential amplifier.

9 Claims, 3 Drawing Figures

AMPLIFIER

BACKGROUND OF THE INVENTION

1. Field of the Invention

This invention relates generally to an amplifier, and is directed more particularly to an amplifier with a differential amplifier.

2. Description of the Prior Art

In the art there has been known such an amplifier which includes a differential amplifier formed of two transistors and a collector follower transistor connected directly to the output side of the differential amplifier. Such a prior art amplifier is shown in FIG. 1. As shown in FIG. 1, a differential amplifier A is formed of two transistors $Q_1$ and $Q_2$ whose emitter electrodes are connected together through an emitter resistor $R_2$ to one terminal $-V_{CC}$ of a voltage source, and whose base electrodes are connected to input terminals $T_1$ and $T_2$, respectively. The collector electrode of the transistor $Q_2$ is connected to the other terminal $+V_{CC}$ of the voltage source and the collector electrode of the transistor $Q_1$ is connected through a resistor $R_1$ to the terminal $+V_{CC}$ and also to the base electrode of another transistor $Q_3$, whose emitter electrode is connected through a resistor $R_3$ to the terminal $+V_{CC}$ and whose collector electrode is connected to an output terminal $T_3$ and also to the terminal $-V_{CC}$ through a resistor $R_4$.

With such a prior art amplifier, if the differential amplifier A is formed completely or ideally, even when an input signal with components which are the same in phase are supplied to the input terminals $T_1$ and $T_2$, respectively no signal components which are the same in phase are delivered to the output terminal $T_3$.

However, due to the fact that the transistors $Q_1$ and $Q_2$ which form the differential amplifier A are not uniform in characteristics, when the same signal components in phase are fed to the input terminals $T_1$ and $T_2$, respectively, the same signal components in phase appear at the output terminal $T_3$.

The total gain of the amplifier for the same signal components in phase or the common mode gain CMG is expressed as follows:

$$CMG = R_1/2R_2 \cdot R_4/R_3$$

In the above expression, the factor $R_1/2R_2$ represents the common mode gain of the differential amplifier A itself, and the factor $R_4/R_3$ the gain of the transistor $Q_3$.

With the prior art amplifier, the resistor $R_2$ is used as a constant current source which is made to have a high impedance to reduce the common mode gain.

However, in general the constant current source is formed of a transistor whose emitter electrode is grounded, so that it is impossible to select the impedance of the constant current source infinitely. Therefore, the prior art amplifier can not make its common mode gain zero.

If there is such a common mode gain in an amplifier, there occurs a defect that when the voltage source is made ON and OFF, and its source voltage is changed, noises are caused or the ripple in the voltage source is contained in the signal which deteriorates the S/N ratio.

OBJECTS AND SUMMARY OF THE INVENTION

It is an object of the invention to provide a novel amplifier free from the defects inherent to the prior art amplifier.

It is another object of the invention to provide an amplifier with which the common mode gain caused by the nonuniformity of transistors forming a differential amplifier can be reduced substantially to zero.

It is a further object of the invention to provide an amplifier which is free from noises when the voltage source is made ON and OFF.

It is a further object of the invention to provide an amplifier which does not contain any appreciable ripple in its output signal and hence has a good S/N ratio.

It is a yet further object of the invention to provide an amplifier with which its voltage source ripple filter can be made simple or omitted.

In accordance with an aspect of the present invention, there is provided an amplifier which comprises a differential amplifier consisting of first and second transistor each having first, second and third electrodes, the first electrodes of said first and second transistors being connected to first and second input terminals, respectively, the second electrode of said first transistor being connected to one terminal of a voltage source through a first impedance and the third electrodes of said first and second transistors being connected together to the other terminal of said voltage source through a common impedance having an intermediate tap, a third transistor having first, second and third electrodes, said first electrode of the third transistor being connected to the collector electrode of said first transistor and said second electrode of the third transistor being connected to said one of said voltage source, said third electrode of the third transistor being connected to an output terminal, and a fourth transistor having first, second and third electrodes, said first electrode of the fourth transistor being connected to said intermediate tap of said common impedance, said second electrode of the fourth transistor being connected to the other terminal of said voltage source, said third electrode of the fourth transistor being connected to the third electrode of said third transistor, said fourth transistor being used for reducing the common mode gain of said differential amplifier.

The other objects, features and advantages of the invention will become apparent from the following description taken in conjunction with the accompanying drawings.

DESCRIPTION OF THE PREFERRED EMBODIMENTS

The invention will be hereinafter described with reference to FIGS. 2 and 3.

Figure 1:
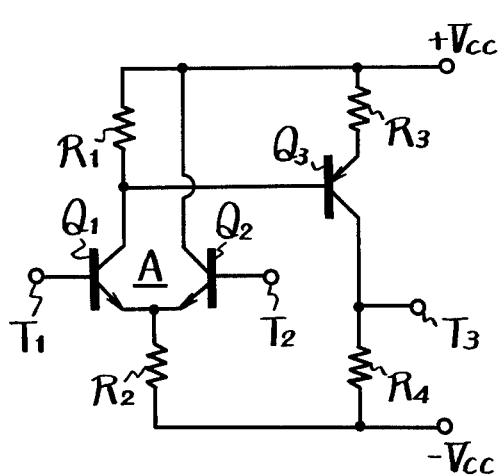
FIG. 1 is a circuit diagram showing the prior art amplifier.

An example of the amplifier according to the invention will be now described with reference to FIG. 2, in which the parts corresponding to those of FIG. 1 are marked with the corresponding numerals and letters and their description will be omitted for the sake of brevity.

Figure 2:
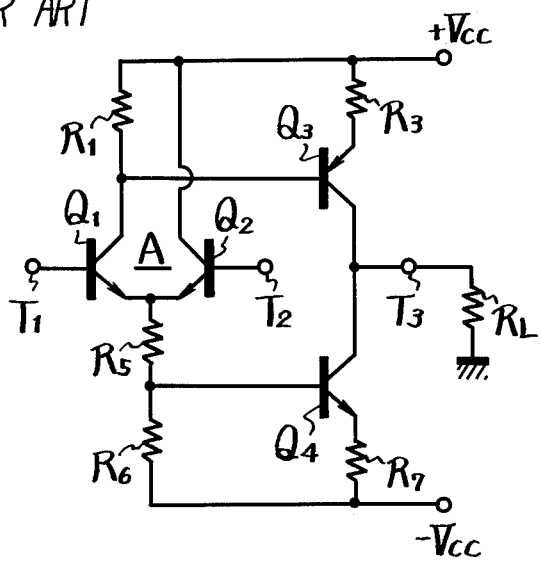
FIG. 2 is a circuit diagram showing an example of the amplifier according to the present invention.

As shown in FIG. 2, in the amplifier of the invention, two resistors $R_5$ and $R_6$, which are connected in series, are used in place of the emitter resistor $R_2$ of the transistors $Q_1$ and $Q_2$, which form the differential amplifier A of the prior art amplifier shown in FIG. 1, and a series circuit of a transistor $Q_4$ and a resistor $R_7$ is used in place of the collector resistor $R_4$ for the transistor $Q_3$ of the prior art amplifier shown in FIG. 1. The connection point between the resistors $R_5$ and $R_6$ is connected to the base electrode of the transistor $Q_4$ whose emitter electrode is connected to the negative voltage source terminal $-V_{CC}$ through the resistor $R_7$ and whose collector electrode is connected to the collector of the transistor $Q_3$. The output terminal $T_3$ is led out from the connection point between the collector electrodes of the transistors $Q_3$ and $Q_4$, and a load resistor $R_L$ is connected between the output terminal $T_3$ and ground. The rest of the circuit construction of the amplifier of the invention shown in FIG. 2 is substantially the same as that of the prior art amplifier shown in FIG. 1.

With the amplifier of the invention shown in FIG. 2, when signal components which are the same in phase are supplied to the input terminals $T_1$ and $T_2$, the signal components appear through the transistor $Q_3$ at its collector electrode. However, at this time the signal components which are the same in phase and supplied to the terminals $T_1$ and $T_2$ are added to each other without being cancelled and appear at the emitter electrodes of the transistors $Q_1$ and $Q_2$. The signal components appeared at the collector electrodes of the transistors $Q_1$ and $Q_2$ are divided by the resistors $R_5$ and $R_6$, then reversed in phase by the transistor $Q_4$, and appear at the collector electrode thereof with the phase reversed from that appearing at the collector electrode of the transistor $Q_3$. Thus, if the common mode gain is equal, the signal components appearing at the collector electrode of the transistor $Q_3$ are cancelled out by the signal components appearing at the collector electrode of the transistor $Q_4$ and hence no signal components which are the same in phase are delivered to the output terminal $T_3$.

The common mode gain CMG of the amplifier of the invention shown in FIG. 2 is expressed as follows:

$$CMG = \frac{R_1}{2(R_5+R_6)} \cdot \frac{R_L}{R_3} - \frac{R_6}{R_5+R_6} \cdot \frac{R_L}{R_7}$$

In the above expression, the first factor $$\left( \frac{R_1}{2(R_5+R_6)} \cdot \frac{R_L}{R_3} \right)$$

represents the common mode gains of the differential amplifier A and the transistor $Q_3$, the former half $(R_6/(R_5+R_6))$ of the second factor the dividing ratio of the resistors $R_5$ and $R_6$, and the latter half $(R_L/R_7)$ of the second factor the gain of the transistor $Q_4$, respectively.

Accordingly, the common mode gain CMG of the amplifier shown in FIG. 2 can be rewritten as follows:

$$CMG = \frac{R_L}{R_5+R_6} \left( \frac{R_1}{2R_3} - \frac{R_6}{R_7} \right)$$

Therefore, if the resistance values $R_1$, $R_3$, $R_6$ and $R_7$ of the respective resistors are selected to satisfy $$\frac{R_1}{2R_3} = \frac{R_6}{R_7}$$

or $$R_1 \cdot R_7 = 2R_3 \cdot R_6$$

the common mode gain CMG is made zero (CMG = 0) and hence no signal components same in phase appear at the output terminal $T_3$.

An audio main amplifier, in which the amplifier of the invention is employed, will be now described with reference to FIG. 3, in which reference numerals being the same as those used in FIG. 2, which designate the same element, and their detailed description will be omitted.

Figure 3:
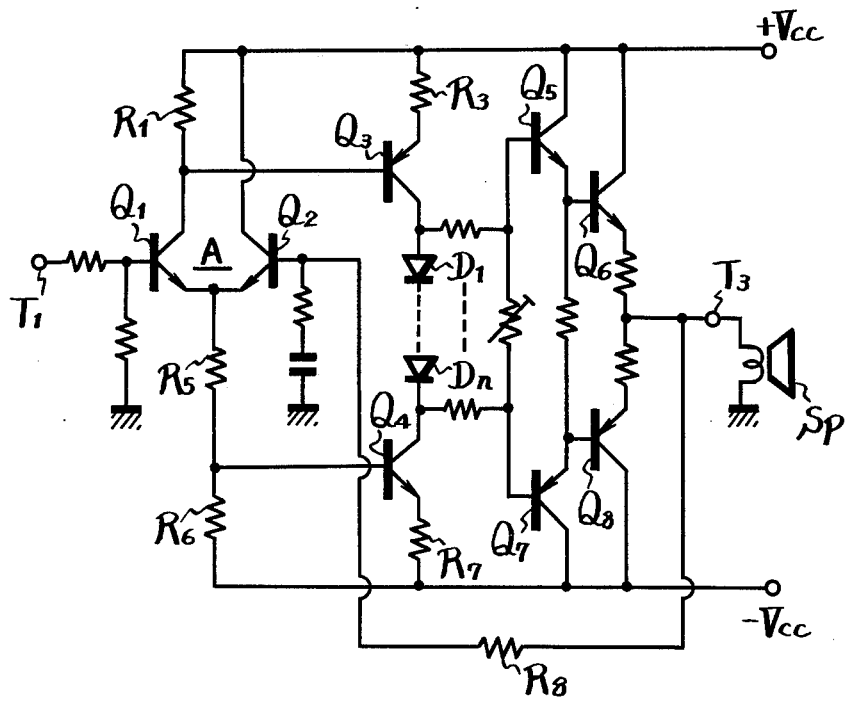
FIG. 3 is a circuit diagram showing an audio main amplifier in which the amplifier of the invention is used.

In the audio main amplifier shown in FIG. 3, a series connection of diodes $D_1, \ldots D_n$ of the same polarity is connected between the collector electrodes of the transistors $Q_3$ and $Q_4$. Transistors $Q_5$ and $Q_6$ are connected in a Darlington connection, and transistors $Q_7$ and $Q_8$ are connected also in a Darlington connection. The transistors $Q_5$ to $Q_8$ are further connected as an SEPP (single-ended push-pull) stage. In this case, the base electrodes of the transistors $Q_5$ and $Q_7$ are connected through resistors to the collector electrodes of the transistors $Q_3$ and $Q_4$, respectively, and a resistor $R_8$ is connected between the base electrode of the transistor $Q_2$ and the output terminal $T_3$, which is led out from the connection point between the emitter electrodes of the transistors $Q_6$ and $Q_8$, to apply a negative feedback. The series connection of the diodes $D_1$ to $D_n$ serves as the bias diode for the transistors $Q_5$ to $Q_7$. In FIG. 3, $S_p$ designates a loudspeaker.

With the amplifier shown in FIG. 3, if the resistors $R_1$, $R_3$, $R_6$ and $R_7$ are selected in resistance value as in the case of FIG. 2, there appear no signal components the same in phase. As a result, there is no fear that when the voltage source is made ON and OFF, that the loudspeaker $S_p$ will be damaged by noises, or that uncomfortable sounds will be emitted from the loudspeaker $S_p$ or that the S/N ratio will be deteriorated by ripples.

In general, in the main amplifier, it is difficult to eliminate ripple components as much as desired due to the current capacity of the voltage source, but with the main amplifier using the amplifier of the invention no ripples are contained in the output signal and its S/N ratio is good.

Further, with the present invention even if the ripple filter for the voltage source is made simple or the ripple filter is omitted, no ripple is contained in the output signal.

The above description is given on only one preferred embodiment of the invention, but it will be apparent that many modifications and variations could be effected by one skilled in the art without departing from the spirit and scope of the novel concepts of the present invention.

I claim as my invention:
1. An amplifier comprising:
   a. a differential amplifier consisting of first and second transistor each having first, second and third electrodes, the first electrodes of said first and second transistors being connected to first and second input terminals, respectively, the second electrode of said first transistor being connected to one terminal of a voltage source through a first impedance, and the third electrodes of said first and second transistors being connected together to the other terminal of said voltage source through a common impedance means having an intermediate tap;

b. a third transistor having first, second and third electrodes, said first electrode of the third transistor being connected to the second electrode of said first transistor and said second electrode of the third transistor being connected to said one terminal of said voltage source, said third electrode of the third transistor being connected to an output terminal; and c. a fourth transistor having first, second and third electrodes, said first electrode of the fourth transistor being connected to said intermediate tap of said common impedance means, said second electrode of the fourth transistor being connected to the other terminal of said voltage source, said third electrode of the fourth transistor being connected to the third electrode of said third transistor, said fourth transistor causing reduction of the common mode gain of said differential amplifier.

2. An amplifier according to claim 1, which further includes second and third impedances which are connected between the second electrode of said third transistor and the one terminal of said voltage source, and between the second electrode of said fourth transistor and the other terminal of said voltage source, respectively.

3. An amplifier according to claim 2, in which said common impedance means comprises a series connection of fourth and fifth impedances, the connection point of which is said intermediate tap.

4. An amplifier according to claim 3, in which each of said first through fifth impedances comprises a resistor, respectively.

5. An amplifier according to claim 4, in which the resistance values of said first, second, third and fifth resistors are selected to satisfy the following equation, $$\frac{R_1}{2R_2} = \frac{R_5}{R_3}$$

wherein $R_1$, $R_2$, $R_3$, $R_5$ indicate the resistance values of said first, second, third and fifth resistors, respectively.

6. An amplifier according to claim 5, which further includes a single ended push-pull amplifying stage connected to said output terminal.

7. An amplifier according to claim 6, in which said push-pull amplifying stage includes at least a pair of transistors connected in complementary push-pull relationship to each other, the connection pair of which is connected to a loudspeaker.

8. An amplifier comprising:

a. a differential amplifier consisting of first and second transistors each having base, collector, and emitter, the bases of said first and second transistors being connected to first and second input terminals, respectively, the collector of said first transistor being connected to one terminal of a voltage source through first resistor, the collector of said second transistor being connected to said one terminal of said voltage source, and the emitters of said first and second transistors being connected together to the other terminal of said voltage source through a series connection of second and third resistors;

b. a third transistor having base, collector and emitter, said base being connected to the connection point of said first resistor with the collector of said first transistor, said emitter being connected to one terminal of said voltage source through a fourth resistor, and said collector being connected to an output terminal; and c. a fourth transistor having base, collector and emitter, said base being connected to the connection point of said second and third resistor, said emitter being connected to the other terminal of said voltage source through a fifth resistor, said collector being connected to said output terminal.

9. An amplifer which includes a common emitter differential amplifier and a single-ended push-pull main amplifier connected to the output thereof, comprising first and second NPN transistors, a positive and a negative voltage terminal, said differential amplifier having a signal input terminal connected to the base of said first NPN transistor through a first resistor, a base bias resistance connecting said base of said first NPN transistor to ground, the emitters of said first and second NPN transistors being connected together and then through series connected third and fourth resistors to said negative voltage terminal, the collector of said first NPN transistor being connected through a fifth resistor to said positive voltage terminal, the collector of said second NPN transistor being connected to said positive voltage terminal, a first PNP transistor having its emitter connected to said positive voltage terminal through a sixth resistor and having its base connected to the mid-point between said collector of said first NPN transistor and said fifth resistor, a third NPN transistor having its base connected to the mid-point between said series connected third and fourth resistors, the emitter of said third NPN transistor being connected through a seventh resistor to said negative voltage terminal, the collector of said first NPN transistor being connected to the collector of said third NPN transistor through a plurality of series connected diodes, a fourth NPN transistor and a second PNP transistor having their bases connected together through a variable resistor and their emitters connected together through an eighth resistor, a fifth NPN transistor and a third PNP transistor having their respective bases connected to the emitters respectively of said fourth NPN transistor and said second PNP transistor and their emitters connected together through ninth and tenth resistors, the midpoint between said last two resistors being connected to an output terminal and also through a further resistor to the base of said second NPN transistor, the collectors of said fifth NPN transistor and said third PNP transistor being connected to the positive and negative voltage terminals, respectively.

* * * * *